United States Patent [19]
Hardin

[11] Patent Number: 6,167,103
[45] Date of Patent: Dec. 26, 2000

[54] VARIABLE SPREAD SPECTRUM CLOCK

[75] Inventor: Keith Bryan Hardin, Lexington, Ky.

[73] Assignee: Lexmark International, Inc., Lexington, Ky.

[21] Appl. No.: 09/169,110

[22] Filed: Oct. 8, 1998

[51] Int. Cl.⁷ .............................. H04L 7/00; H04K 1/00
[52] U.S. Cl. ............................................ 375/376; 375/130
[58] Field of Search .................................. 375/200, 376, 375/372, 373, 130; 327/162, 156, 160

[56] References Cited

U.S. PATENT DOCUMENTS

| | | | |
|---|---|---|---|
| 5,311,542 | 5/1994 | Eder | 375/200 |
| 5,488,627 | 1/1996 | Hardin et al. | 375/204 |
| 5,631,920 | 5/1997 | Hardin | 375/200 |
| 5,867,524 | 2/1999 | Booth et al. | 375/376 |
| 5,872,807 | 2/1999 | Booth et al. | 375/200 |

*Primary Examiner*—Tesfaldet Bocure
*Attorney, Agent, or Firm*—John A. Brady

[57] ABSTRACT

A digital spread spectrum clock circuit is made variable by employing RAM memory (29), and a multiplexer (39) to receive initiation data before the circuit is ready to run normally. A second counter (17) and an adder (25) each receiving the contents of programmable registers (17 and 25) permit wide variation in operation although RAM memory is of relatively small size.

23 Claims, 2 Drawing Sheets

VARIABLE SPREAD SPECTRUM CLOCK

FIELD OF THE INVENTION

This invention relates to the field of digital circuits, and more particularly, to a clock circuit having reduced measurable electromagnetic interference (EMI) emissions.

BACKGROUND OF THE INVENTION

Effective reduction of EMI by spread spectrum clocking is shown in two patents for which the inventor of this invention is also an inventor. These are U.S. Pat. Nos. 5,488,627 and 5,631,920. Both of these patents show circuits in which the spread algorithm is stored by differing digits addressed in memory. Since the memories are read only (ROM) memories, the circuits disclosed are fixed into one mode of operation.

It is desirable that each circuit be readily variable so that the same hardware design may be produced in volume, yet the circuit may be varied in use, either radically for widely different requirements, moderately for switching to a low activity mode, or slightly to optimize the operation for otherwise identical operation.

SUMMARY OF THE INVENTION

As with prior circuits disclosed in the foregoing patents, a reference signal drives one input of a phase detector while the other input is varied by values which define the spread spectrum. In accordance with this invention, the memory for such value receives and stores variable data. The memory is loaded with such data at initialization or power-on reset by the data processor. At such initiation the circuit passes signals from the data processor to the components which vary the spectrum. At the end of initialization, the memory has control data and the data processor issues a signal which causes the circuit to pass signals from the memory to the components which vary the spectrum.

The circuitry which controls the spectrum is a loop having two counters. One is set from a register which is programmable. That one drives a counter which is set from the memory. This combined use of the register and the memory permits the memory size to be substantially reduced. Similarly, such memory size is further reduced by the output of the memory being added to the programmable content of a register, with that sum being entered into the second counter.

BRIEF DESCRIPTION OF THE DRAWINGS

The details of this invention will be described in connection with the accompanying drawings, in which.

DESCRIPTION OF THE PREFERRED EMBODIMENTS

Figure 1:
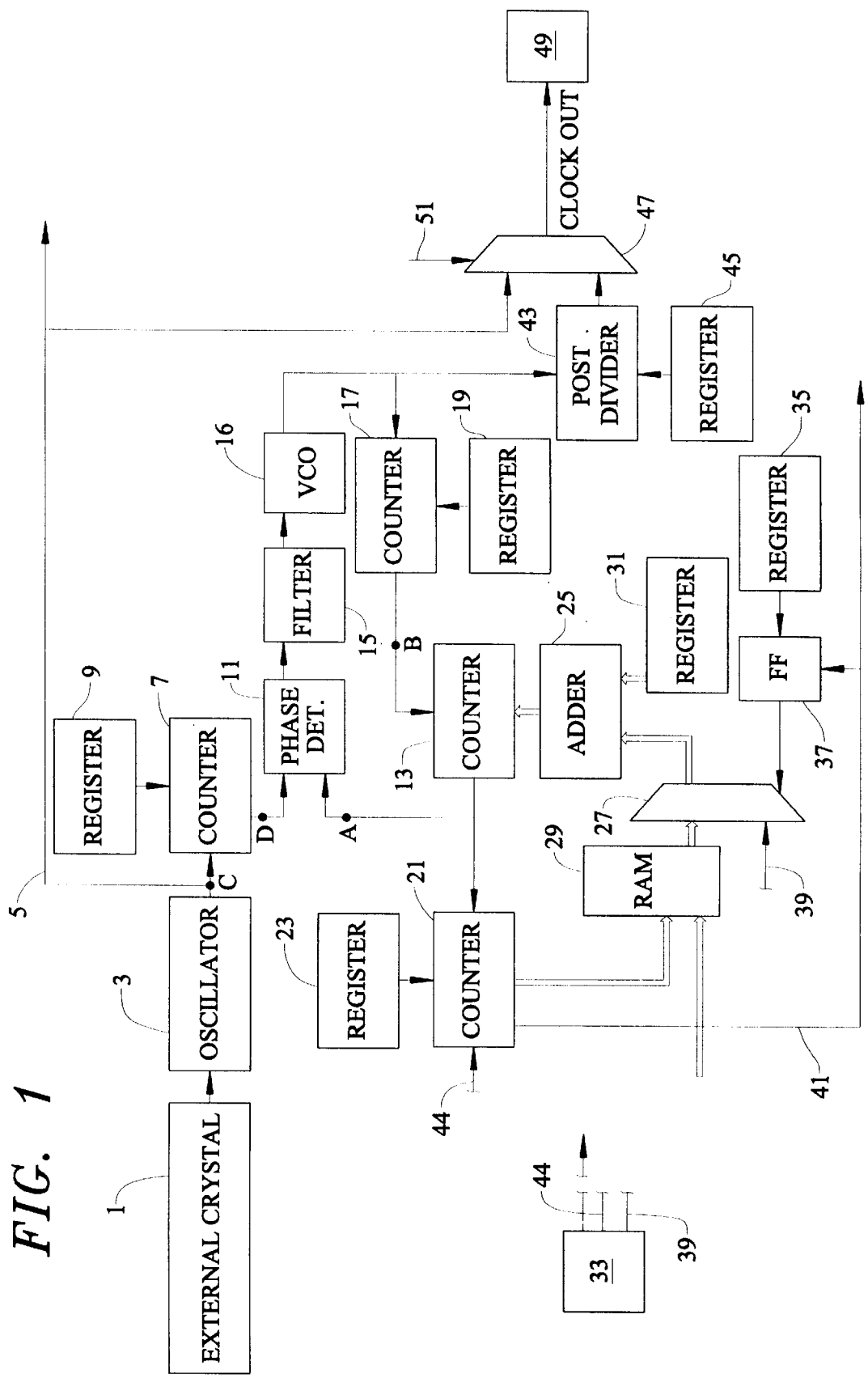
FIG. 1 is a functional circuit diagram of one embodiment and FIG. 2 is a similar drawing of a very similar equivalent embodiment.

Referring to FIG. 1, a crystal 1 or outer standard reference source controls a steady state oscillator 3. The preferred frequency may be 3.5 megaHz to 100 megaHz. Line 5 is a lead from oscillator 3 bypassing the spread spectrum control circuit.

Oscillator 3 drives thirty-two state counter 7. For all counters in this embodiment an output is produced when the counter reaches a maximum or terminal count (thirty-two in the case of counter 7) by counting up or down. The counter sizes are preferred but other sizes may be used depending on application. The count begins at the reset amount. (Assuming register 9 contains 8, counter 8 reaches 0 (i.e., is reset at count 32) after 24 transitions from oscillator 3, at which time it produces an output pulse to phase detector 11 and 15 again reset to 8.) Register 9 is programmable at initialization.

The output of phase detector 11 is switched current signal proportional in time to the difference in phase between the signal from counter 7 and the signal from 256 state counter 13, which is the other input to phase detector 11. The output of phase detector 11 passes to loop filter 15; the output of loop filter 15 drives voltage controlled oscillator 16. (Phase detector 11 with filter 15 is also known as phase/frequency detector and charge pump.) The foregoing description of elements 11, 15 and 16 may be entirely standard elements of phase locked loops, the loop filter 15 typically being a shunt circuit to ground of a capacitor (not shown) in parallel with a resistance and capacitance (not shown) in series.

Voltage controlled oscillator 16 drives 1 (i.e., bypass) or more state counter 17, which is reset by programmable register 19. The output of counter 13 drives one input of phase detector 11 and 256 state counter 21. Counter 21 is reset by programmable register 23.

Counter 13 is reset with entry of the content of adder 25 from the output of adder 25. During normal operation switching circuit (multiplexer) 27 passes four bits of digital data from 256 byte random access memory 29 to one input of adder 25. A second input of adder 25 receives the digital content of register 31. The data from memory 29 and register 31 are summed in adder 25. Counter 13 is reset when it reaches 256 to the content of adder 25.

At initiation data processor 33 (shown illustratively, normally a microprocessor) first loads programmable register 35 to a value which sets flip flop circuit 37 which controls multiplexer 27 to pass signals only on line 39. Signals on line 39 are from data processor 33. These signals are initiation data. The initiation data may define some spread spectrum characteristics, but this is not essential since they control only during initiation. Initially all of the registers are at a preset value, but oscillator 3, the counters and the phase locked loop, including voltage controlled oscillator 16, are operational, so a clock signal is generated. Using the clock signal, data processor 33 fills the programmable registers and RAM 29 and applies a start signal on line 44. The start signal on line 44 resets counter 21 and produces a signal on line 41 which reverses flip flop 37, causing multiplexer 27 to pass only the data from memory 29. The reset signal on line 44 may also be delivered by different devices, like video, horizontal sync, another spread spectrum generator or any signal that the modulation profile is to be synchronized to.

Memory 29 has variable data uniquely addressed by each output of counter 21 to define a spread spectrum output from the output of voltage controlled oscillator 16. This is reduced in frequency by being input to divider 43 (also a counter) which is reset by register 45. (Register 45 is not variable.)

The output of divider 43 is connected through multiplexer 47 to drive an electrical apparatus 49 (shown illustratively) such as a printer or computer. Multiplexer 47 may be switched by a signal on line 51 to pass the signal on line 5 from oscillator 3, thereby bypassing the spread spectrum signal.

The preferred forms of spread spectrum signals are discussed in the foregoing patents and will not be repeated here.

The contents of counter 17 varies the period of time before a single digital value from RAM 29 produces an output from counter 13. The content of register 23 defines the number of values, from RAM 29 used before the pattern is repeated. Of course, the content of RAM 29 is selected to conform to the register values and the desired spread spectrum pattern.

This architecture has extreme flexibility for range of operation and possible location on applications. It has also been determined that an approximate bandwidth of 40 kHz–150 kHz for the closed loop phase locked loop bandwidth is the best mode to operate the phase locked loop to give a smooth, accurate profile for voltage controlled oscillator frequencies between 96 MHz to 200 MHz respectively. The ideal transfer function with operating point of the phase locked loop is shown below as a standard Laplace transform. $CL_{tf}(s)$ is the ratio of clock output frequency to the input frequency at the reference input of the phase detector 11. This transfer function is used to determine the values of the phase locked loop parameters which include the voltage controlled oscillator 16 gain, filter 15 current, capacitance to ground of filter 15, resistance capacitance in series to ground of filter 15, for given feedback division and input frequency values. The values for $n_1$, $n_2$, $d_1$, $d_2$ and $d_3$ were empirically determined for the particular operating point and are directly related to the phase locked loop parameters listed above.

$$CL_{tf}(s) = \frac{\frac{VCO \cdot CP}{PD \cdot C_1} \cdot \left(s + \frac{1}{R_1 \cdot C_2}\right)}{s^3 + \frac{C_1 + C_2}{R_1 \cdot C_1 \cdot C_2} s^2 + \frac{CP \cdot VCO}{FBD \cdot C_1} s + \frac{CP \cdot VCO}{FBD \cdot R_1 \cdot C_1 \cdot C_2}}$$

$$= \frac{n_1 \cdot (s + n_2)}{s^3 + d_1 \cdot s^2 + d_2 \cdot s + d_3}$$

where $VCO = VCO$ gain $\frac{MHz}{volt}$

CP=filter current $\mu A$
PD=post divider number
FBD=feedback divider number
$C_1$, $C_2$, $R_1$=loop filter values
The design point is set at:
$n_1 = 6.04167 * 10^{10}$
$n_2 = 2.77778 * 10^4$
$d_1 = 3.61111 * 10^5$
$d_2 = 6.04167 * 10^{10}$
$d_3 = 1.67824 * 10^{15}$ Is This circuit is entirely flexible and may be used for a wide variety of applications, all under program control of data processor 33.

Figure 2:
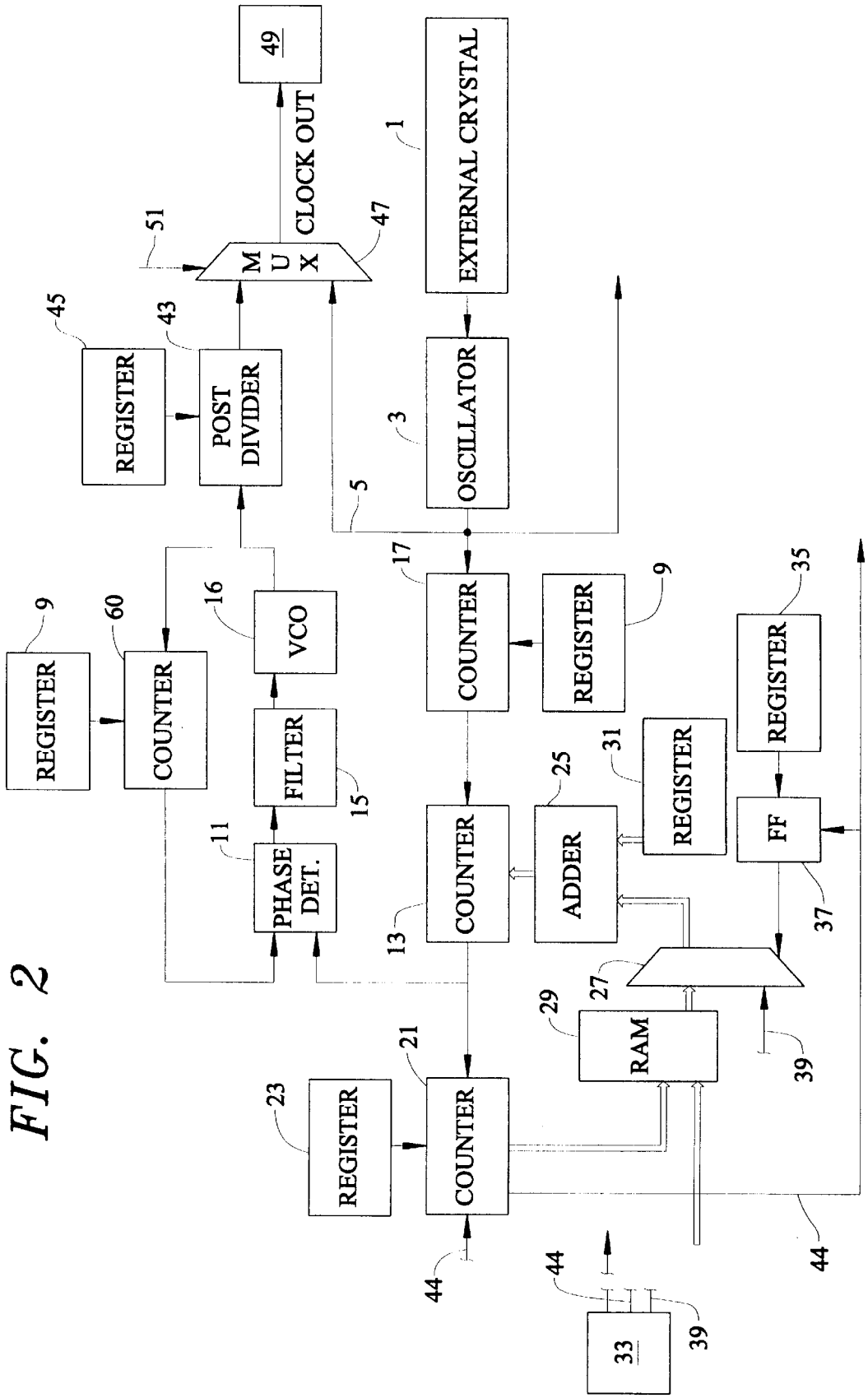

In the alternative embodiment of FIG. 2 elements having substantially identical function to those of the FIG. 1 embodiment have the same reference numerals. Consistent with that, only 256 state counter 60 has a new number. That is true because the output of voltage controlled oscillator 16 is employed, through counter 60, as the reference signal input in the phase locked loop formed by phase detector 11, loop filter 15 and voltage controlled oscillator 16. The data entered in RAM 29 is somewhat different from that of the FIG. 1 embodiment to provide the desired spectrum where the reference signal source of the phase locked loop is the voltage controlled oscillator 16 rather than the external crystal 1 and the external crystal 1 directly drives counter 17.

Many modifications and other embodiments of the invention will come to the mind of one skilled in the art having the benefit of the teachings presented in the forgoing descriptions and the associated drawings. Therefore, it is to be understood that the invention is not to be limited to the specific embodiments disclosed, and that modifications and embodiments are intended to be included within the scope of the appended claims.

What is claimed is:

1. A clock controlled electronic device having a clock to provide spread spectrum clock signals to said device, said spread spectrum clock comprising a programmable memory to store a table of digital values, a first counter to address said table at different parts of said table determined by different counts of said first counter a switching circuit to transfer the contents of said memory when in a running state, and to transfer initiation data when in an initiation state, a second counter to receive said stored digital values addressed by said different counts of said first counter when said switching circuit is in said running state, said second counter being responsive to clock signals to step said second counter after said second counter receives each said digital value, a phase detector responsive to the difference in phase of two inputs to produce an output representative of the phase difference of said two inputs of said phase detector, said second counter providing an output signal upon reaching a predetermined value, said output signal providing a control signal to step the count of said first counter and said output signal providing one input to said phase detector, a source of reference signals providing the second input of said phase detector, a voltage controlled oscillator having an input receiving said output of said phase detector to form a voltage controlled oscillator, the output of said phase locked loop providing said spread spectrum clock signals to said device.

2. The device as in claim 1 also comprising a third counter between the output of said phase locked loop and the input of said second counter.

3. The device as in claim 2 also comprising a first register, said first register being programmable, the output of said first register providing digital values to said third counter upon reset of said third counter.

4. The device as in claim 1 also comprising a second register and an adder, said adder having two inputs and an output, one of said inputs of said adder receiving said values from said memory, the other of said inputs of said adder receiving the contents of said second register, the output of said adder providing digital values to said second counter at reset of said second counter.

5. The device as in claim 2 also comprising a second register and an adder, said adder having two inputs and an output, one of said inputs of said adder receiving said values from said memory, the other of said inputs of said adder receiving the contents of said second register, the output of said adder providing digital values to said second counter at reset of said second counter.

6. The device as in claim 3 also comprising a second register and an adder, said adder having two inputs and an output, one of said inputs of said adder receiving said values from said memory, the other of said inputs of said adder receiving the contents of said second register, the output of said adder providing digital values to said second counter as reset of said second counter.

7. The device as in claim 4 in which said second register is programmable.

8. The device as in claim 5 in which said second register is programmable.

9. The device as in claim 6 in which said second register is programmable.

10. A clock controlled electronic device having clock to provide spread spectrum clock signals to said device, said spread spectrum clock comprising a programmable memory to store a table of digital values, a first counter to address said table at different parts of said table determined by different counts of said first counter, a second counter to receive said stored digital values addressed by said different counts of said first counter, said second counter being responsive to clock signals to step said second counter after said second counter receives each said digital value, a phase detector responsive to the difference in phase of two inputs to produce an output representative of the phase difference of said two inputs of said phase detector, a voltage controlled oscillator having an input receiving said output of said phase detector and an output connected to a third counter, the output of said third counter being connected to the input of said second counter, the output of said second counter providing one input of said phase detector a source of reference signals providing the second input of said phase detector to form a voltage controlled oscillator, the output of said voltage controlled oscillator providing said spread spectrum clock signals to said device.

11. The device as in claim 10 also comprising a first register and an adder having two inputs and an output, one of said inputs of said adder receiving said values from said memory, the other of said inputs of said adder receiving the contents of said first register the output of said adder providing digital values to said second counter at reset of said second counter.

12. The device as in claim 10 also comprising a second register, said second register being programmable, said second register providing digital values to said third counter upon reset of said third counter.

13. The device as in claim 11 also comprising a second register, said second register being programmable, said second register providing digital values to said third counter upon reset of said third counter.

14. The device as in claim 11 in which said first register is programmable.

15. The device as in claim 12 in which said first register is programmable.

16. The device as in claim 13 in which said first register is programmable.

17. The device as in claim 10 also comprising a switching circuit to transfer the contents of said memory to said second counter when in a running state and to transfer initiation data to said second counter when in an initiation state.

18. The device as in claim 11 also comprising a switching circuit the output of said switching providing the contents of said memory to said one input of said adder when in a running state and providing initiation data to said one input of said adder when in an initiating state.

19. The device as in claim 12 also comprising a switching circuit to transfer the contents of said memory to said second counter when in a running state and to transfer initiation data to said second counter when in an initiation state.

20. The device as in claim 13 also comprising a switching circuit the output of said switching providing the contents of said memory to said one input of said adder when in a running state and providing initiation data to said one input of said adder when in an initiating state.

21. The device as in claim 14 also comprising a switching circuit the output of said switching providing the contents of said memory to said one input of said adder when in a running state and providing initiation data to said one input of said adder when in an initiating state.

22. The device as in claim 15 also comprising a switching circuit the output of said switching providing the contents of said memory to said one input of said adder when in a running state and providing initiation data to said one input of said adder when in an initiating state.

23. The device as in claim 16 also comprising a switching circuit the output of said switching providing the contents of said memory to said one input of said adder when in a running state and providing initiation data to said one input of said adder when in an initiating state.

* * * * *